US012696522B2

(12) United States Patent
Chen et al.

(10) Patent No.: US 12,696,522 B2
(45) Date of Patent: Jul. 28, 2026

(54) CMOS WELL REGIONS WITH HIGH DOPANT ACTIVATION LEVEL AND REDUCED EXTENDED DEFECTS

(71) Applicant: Taiwan Semiconductor Manufacturing Company, Ltd., Hsinchu (TW)

(72) Inventors: Yi-Fan Chen, New Taipei City (TW); Sen-Hong Syue, Hsinchu County (TW); Huicheng Chang, Tainan City (TW); Yee-Chia Yeo, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 557 days.

(21) Appl. No.: 17/751,663

(22) Filed: May 24, 2022

(65) Prior Publication Data

US 2024/0006246 A1     Jan. 4, 2024

(51) Int. Cl.
| | |
|---|---|
| *H10D 84/03* | (2025.01) |
| *H10D 84/01* | (2025.01) |
| *H10P 34/42* | (2026.01) |
| *H10P 72/00* | (2026.01) |
| *H10P 72/76* | (2026.01) |
| *H10P 74/00* | (2026.01) |

(52) U.S. Cl.
CPC ......... *H10D 84/038* (2025.01); *H10D 84/017* (2025.01); *H10D 84/0186* (2025.01); *H10D 84/0191* (2025.01); *H10D 84/0193* (2025.01); *H10P 34/422* (2026.01); *H10P 72/0436*

(2026.01); *H10P 72/0602* (2026.01); *H10P 72/7618* (2026.01); *H10P 74/23* (2026.01)

(58) Field of Classification Search
CPC ...................... H01L 21/2686; H01L 21/67248
See application file for complete search history.

(56) References Cited

U.S. PATENT DOCUMENTS

| | | | | |
|---|---|---|---|---|
| 10,297,492 B2* | 5/2019 | Tsai | ......................... | H01L 29/36 |
| 2014/0087547 A1* | 3/2014 | Miyano | ............. | H01L 21/67103 438/530 |
| 2020/0006545 A1* | 1/2020 | Liu | ...................... | H10D 62/151 |
| 2021/0166945 A1* | 6/2021 | Hirochi | ............. | H01L 21/67115 |
| 2021/0358799 A1 | 11/2021 | Tsai et al. | | |

FOREIGN PATENT DOCUMENTS

| | | | | |
|---|---|---|---|---|
| JP | 2014063897 | * | 4/2014 | ........... H10D 30/024 |

OTHER PUBLICATIONS

First office action received in the counterpart Taiwan application 112109866, mailed on Dec. 12, 2023.

* cited by examiner

*Primary Examiner* — Sarah K Salerno
(74) *Attorney, Agent, or Firm* — Kilpatrick Townsend & Stockton LLP

(57)     ABSTRACT
A method of fabricating an integrated circuit (IC) is provided. The method includes the following steps: providing a substrate; forming a p-well region in the substrate; forming an n-well region in the substrate; conducting a microwave annealing at a first temperature; conducting, after the microwave annealing, a supplemental annealing at a second temperature higher than the first temperature; and fabricating a plurality of field-effect transistors (FETs) in the p-well region and the n-well region.

19 Claims, 9 Drawing Sheets

100

Provide a substrate 102

Form a p-well region 104

Form an n-well region 106

Conduct a microwave annealing at a first temperature 108

Conduct, after the microwave annealing, a supplemental annealing at a second temperature higher than the first temperature 110

Fabricate field-effect transistors (FETs) in the p-well region and the n-well region 112

100

Provide a substrate 102

Form a p-well region 104

Form an n-well region 106

Conduct a microwave annealing at a first temperature 108

Conduct, after the microwave annealing, a supplemental annealing at a second temperature higher than the first temperature 110

Fabricate field-effect transistors (FETs) in the p-well region and the n-well region 112

Thermal Wave Intensity (a.u.)

Dislocation Defect Concentration (cm$^{-2}$)

112

Form fin structures over the p-well region and the n-well region 1102

Form source/drain regions of the fin structures 1104

Form gate structures over the fin structures 1106

Form contact structures over the source/drain regions 1108

CMOS WELL REGIONS WITH HIGH DOPANT ACTIVATION LEVEL AND REDUCED EXTENDED DEFECTS

FIELD

Embodiments of the present disclosure relate generally to semiconductor processing, and more particularly to CMOS well regions with high dopant activation level and reduced extended defects.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

While some integrated device manufacturers (IDMs) design and manufacture integrated circuits (IC) themselves, fabless semiconductor companies outsource semiconductor fabrication to semiconductor fabrication plants or foundries. Semiconductor fabrication consists of a series of processes in which a device structure is manufactured by applying a series of layers onto a substrate. This involves the deposition and removal of various dielectric, semiconductor, and metal layers. The areas of the layer that are to be deposited or removed are controlled through photolithography. Each deposition and removal process is generally followed by cleaning as well as inspection steps. IDMs and foundries rely on numerous semiconductor equipment and semiconductor fabrication materials. There is always a need for improving those semiconductor fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
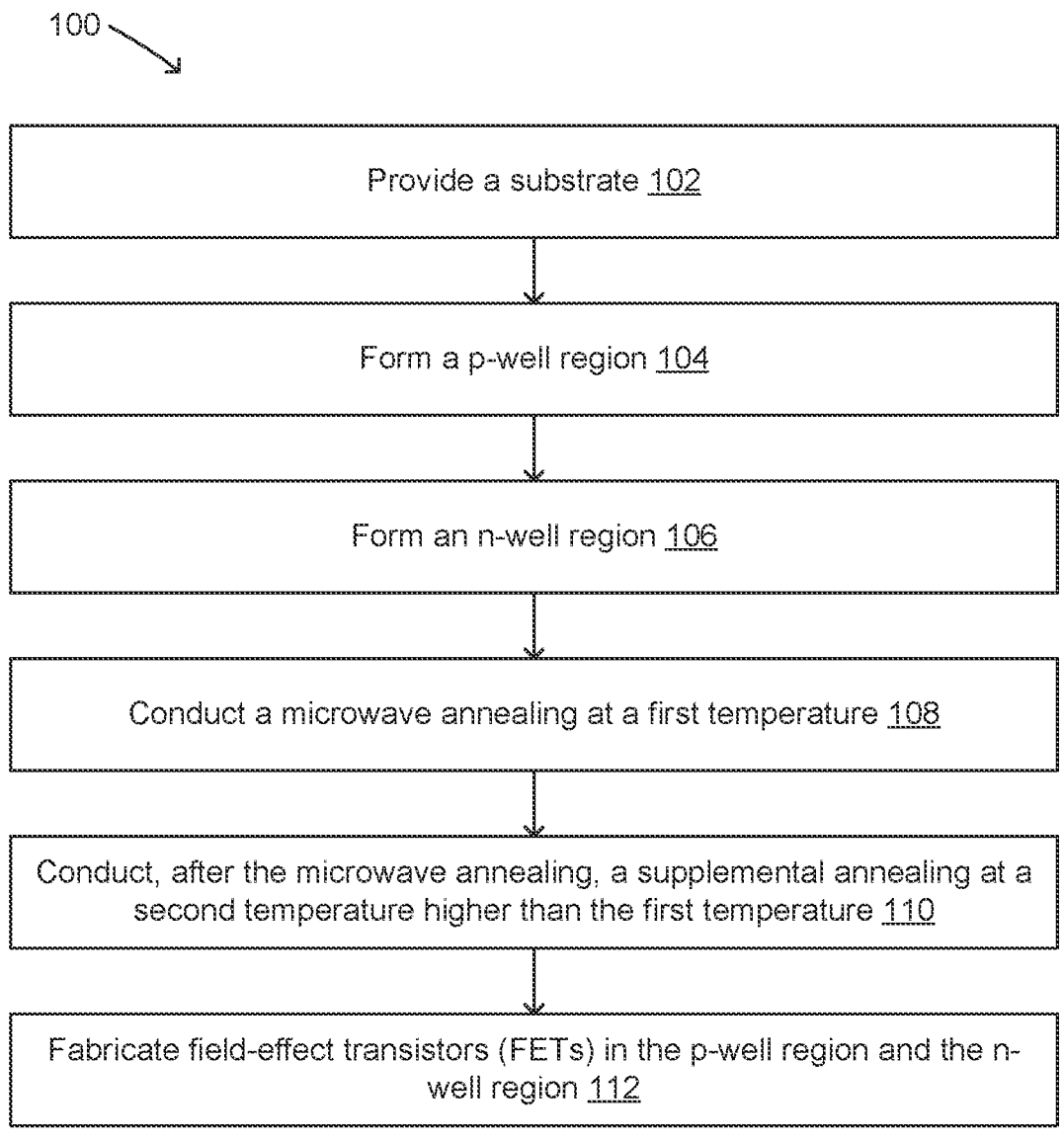
FIG. 1 is a flowchart diagram illustrating an example method for fabricating an integrated circuit (IC) in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

In semiconductor fabrication, ion implantation is used to modify the conductivity of the semiconductor substrate by the implantation of specific dopants such as boron (B), aluminum (Al), gallium (Ga), phosphorus (P), and arsenic (As). After the ion implantation process, an annealing process is often used for dopant activation and defect recovery. For example, high temperature conventional annealing processes with a temperature higher than 900° C. are often used in the fabrication of a complementary metal-oxide-semiconductor (CMOS) integrated circuit (IC). Examples include rapid thermal annealing (RTA), millisecond annealing, and laser annealing. In some cases of CMOS well formation, the annealing temperature for those high temperature conventional annealing processes is raised to above 1000° C., while the annealing time is as short as milliseconds or even microseconds such that high dopant activation can be achieved while preventing dopant diffusion. On the other hand, the peak of the annealing temperature is restricted to be below the melting point of silicon (i.e., 1410° C.).

One problem associated with the high annealing temperature above 1000° C. is increased leakage current due to extended defects. Ion implantation in silicon produces a large amount of point defects. Point defects are defects that occur at or around a single lattice point. In other words, they are not extended in space in any dimension. Point defects typically involve at most a few extra or missing atoms.

Vacancy defects, one type of point defects, are lattice sites which would be occupied in a perfect crystal but are vacant. If a neighboring atom moves to occupy the vacant site, the vacancy moves in the opposite direction to the site which used to be occupied by the moving atom. A vacancy defect is sometimes called a Schottky defect. Interstitial defects, another type of point defects, are atoms that occupy a site in the crystal structure at which there is usually not an atom. Interstitial defects are generally high energy configurations. However, small atoms (mostly impurities) in some crystals can occupy interstices without high energy.

During a high temperature annealing process with the annealing temperature above 1000° C., the large amount of point defects formed during ion implantation tend to recombine or collapse. The collapse or agglomeration of the large amount of point defects results in extended defects such as dislocation loops. Dislocation loops are formed by agglomeration of point defects into plates on densely packed lattice planes.

Dislocation defects such as dislocation loops behave as acceptors in n-doped materials or donors in p-doped materials, which in turn serve as leakage sources. Consequently, the leakage current increases when dislocation defects occurs (e.g., when dislocation loops lie across the p-n junctions of a device), thereby leading to the electrical failure of the device.

In accordance with some aspects of the disclosure, a combination of microwave annealing and supplemental annealing (e.g., conventional annealing techniques) is performed after the ion implantation of a p-well region and an n-well region. The microwave annealing is conducted at a first temperature, whereas the supplemental annealing is conducted at a second temperature higher than the first temperature. In one embodiment, the first temperature is lower than 600° C., while the second temperature is higher than 1000° C.

A lower temperature is needed for the microwave annealing to achieve a median dopant activation level, as compared to conventional annealing techniques at a higher temperature. Because both microwave energy and thermal energy contribute to the activation energy needed to overcome the energy barrier. Dopant loss and dopant diffusion are lower due to the lower temperature. In addition, at the lower temperature, point defects are recovered in the lattice recovery process, rather than recombining or collapsing to form extended defects such as dislocation loops.

Since point defects are recovered in the lattice recovery process during the microwave annealing, extended defects such as dislocation loops can be avoided even the second temperature is above 1000° C. during the supplemental annealing. In addition, the supplemental annealing raises the dopant activation level further to make it comparable to that of a conventional annealing process. Last but not least, the lack of uniformity of the microwave annealing can be compensated by the supplemental annealing.

As a result of the combination of the microwave annealing and the supplemental annealing, the p-well region and the n-well region have at least the following benefits: (i) reduction in extended defects such as dislocation loops; (ii) low leakage current of the devices fabricated thereon due to the reduction in extended defects; (iii) high or comparable dopant activation level; and (iv) low or comparable dopant loss.

Example Process Flow

Figures 2A, 2B, 2C:
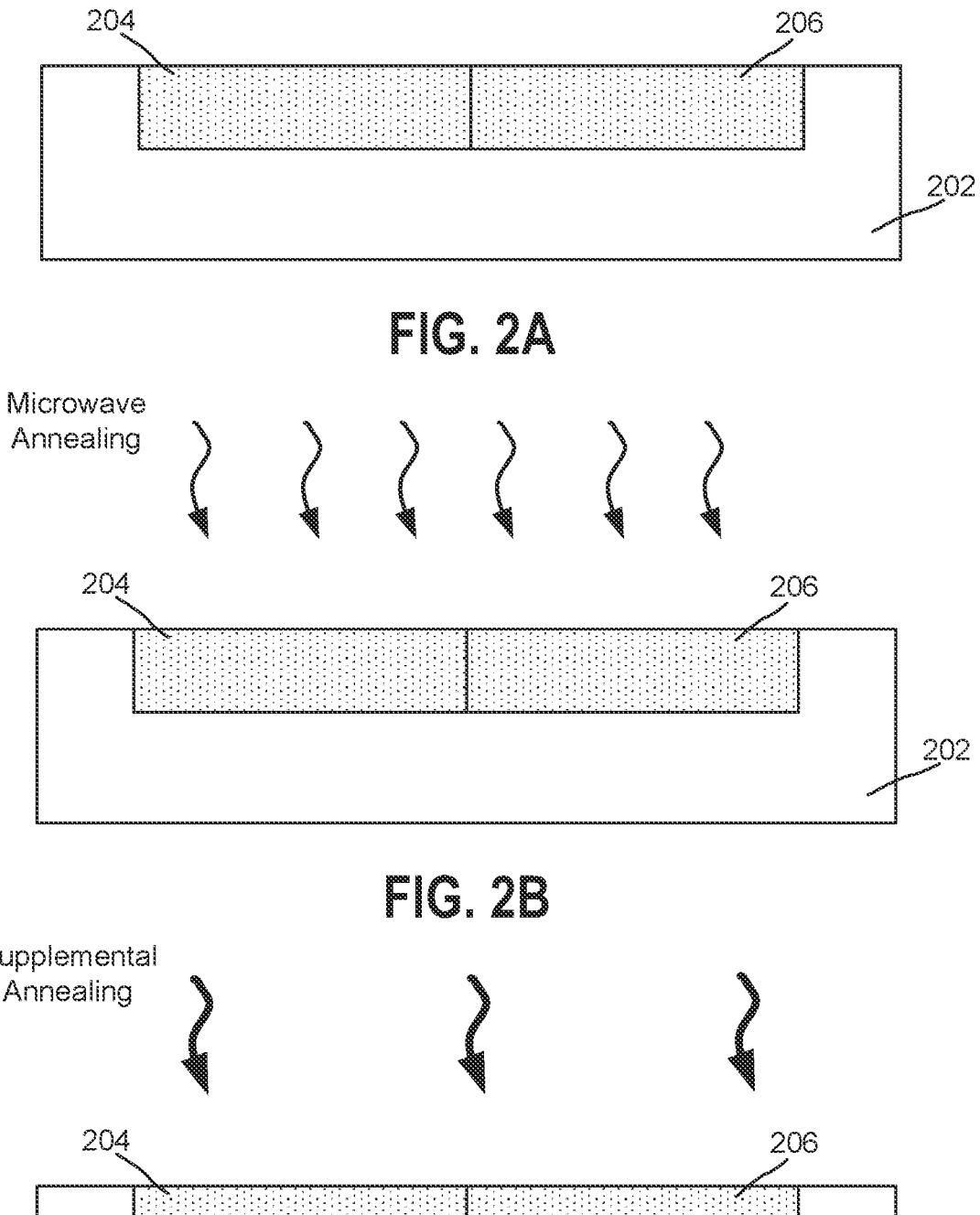
FIGS. 2A-2C are cross-sectional diagrams illustrating example semiconductor structures during various stages in accordance with some embodiments.

FIG. 1 is a flowchart diagram illustrating an example method 100 for fabricating an integrated circuit (IC) in accordance with some embodiments. FIGS. 2A-2C are cross-sectional diagrams illustrating example semiconductor structures during various stages in accordance with some embodiments. In the example shown in FIG. 1, the method 100 includes operations 102, 104, 106, 108, 110, and 112. Additional operations may be performed. Also, it should be understood that the sequence of the various operations discussed above with reference to FIG. 1 is provided for illustrative purposes, and as such, other embodiments may utilize different sequences. For example, operation 106 can be performed prior to operation 104 in another embodiment. These various sequences of operations are to be included within the scope of embodiments.

At operation 102, a substrate is provided. In some embodiments, the substrate may be a bulk semiconductor substrate. In some examples, the substrate may include an elementary semiconductor such as silicon and germanium. In some embodiments, the substrate is a silicon on insulator (SOI) substrate. In some embodiments, the substrate may include a plurality of epitaxial layers (i.e., a multilayer substrate). It should be noted that other types of substrate structures and semiconductor materials are also within the scope of the disclosure.

At operation 104, a p-well region is formed. The p-well region is meant to isolate sources and drains of the semiconductor devices, such as field-effect transistors (FETs), formed therein from the substrate. Examples of FETs include fin field-effect transistors (FinFETs), Gate-All-Around field-effect transistors (GAAFETs), and other types of FETs. Although FinFETs are used as examples throughout the disclosure, it should be understood that this is not intended to be limiting. The techniques discussed in the disclosure can also be applied to other FETs such as GAAFETs as needed. In one embodiment, n-type FinFETs are formed in the p-well region. In one implementation, a p-well mask is used to expose the p-well region for ion implantation and cover other regions, including the n-well region, by photoresist pattern. Subsequently, the exposed p-well region
is implanted with p-type dopants such as boron (B) to define
the p-well region for n-type FinFETs. In one example, the
dosage of the ion implantation ranges from $1\times10^{13}$ cm$^{-2}$ to
$5\times10^{15}$ cm$^{-2}$. In one example, the energy of the ion implan-
tation ranges from 10 KeV to 80 KeV. In the example shown
in FIG. 2A, a p-well region 204 is formed in the substrate
202 at operation 104.

At operation 106, an n-well region is formed. The n-well
region in meant to isolate sources and drains of the FinFETs
formed therein from the substrate. In one embodiment,
p-type FinFETs are formed in the n-well region. In one
implementation, an n-well mask is used to expose the n-well
region for ion implantation and cover other regions, includ-
ing the p-well region, by photoresist pattern. Subsequently,
the exposed n-well region is implanted with n-type dopants
such as phosphorus (P) to define the n-well region for p-type
FinFETs. In one example, the dosage of the ion implantation
ranges from $1\times10^{13}$ cm$^{-2}$ to $5\times10^5$ cm$^{-2}$. In one example, the
energy of the ion implantation ranges from 10 KeV to 80
KeV. In the example shown in FIG. 2A, an n-well region 206
is formed in the substrate 202 at operation 106.

At operation 108, a microwave annealing is conducted at
a first temperature. In the example shown in FIG. 2B, the
substrate 202 is annealed using the microwave annealing at
the first temperature. As will be explained below with
reference to FIGS. 5A, 5B, 6A, and 6B, the first temperature
is lower as compared to conventional annealing techniques
(where the annealing temperature is typically 800° C. or
above) because the activation energy needed to overcome
the energy barrier may come from both the microwave
energy and the thermal energy. In one embodiment, the first
temperature is lower than 800° C. In another embodiment,
the first temperature is lower than 600° C. In one example,
the first temperature is 780° C. In another example, the first
temperature is 750° C. In yet another example, the first
temperature is 700° C. In still another example, the first
temperature is 650° C. In one example, the first temperature
is 600° C. In another example, the first temperature is 600°
C. In yet another example, the first temperature is 550° C. In
still another example, the first temperature is 500° C. In one
example, the first temperature is 450° C. In another example,
the first temperature is 400° C.

As will be explained below with reference to FIGS. 5A,
5B, 6A, and 6B, a lower temperature (e.g., lower than 600°
C. in one example, or lower than 800° C. in another
example) is needed for the microwave annealing to achieve
a median dopant activation level, as compared to conven-
tional annealing techniques at a higher temperature. Dopant
loss and dopant diffusion are lower due to the lower tem-
perature. In addition, at the lower temperature, point defects
are recovered in the lattice recovery process, rather than
recombining or collapsing to form extended defects such as
dislocation loops. In some implementations, the first tem-
perature is selected such that point defects in the p-well
region and the n-well region are recovered.

At operation 110, a supplemental annealing is conducted,
after the microwave annealing, at a second temperature. The
second temperature is higher than the first temperature. In
the example shown in FIG. 2C, the substrate 202 is annealed
using the supplemental annealing at the second temperature.
In one embodiment, the second temperature is higher than
800° C. In another embodiment, the second temperature is
higher than 1000° C. In one example, the second tempera-
ture is 850° C. In another example, the second temperature
is 900° C. In yet another example, the second temperature is
1000° C. In still another example, the second temperature is 1100° C. In one example, the second temperature is 1200°
C. In another example, the second temperature is 1300° C.

Examples of the supplemental annealing include a furnace
annealing, rapid thermal annealing (RTA), millisecond
annealing, microsecond annealing, laser annealing, and
other conventional annealing processes. As mentioned
above, point defects are recovered in the lattice recovery
process during the microwave annealing, extended defects
such as dislocation loops can be avoided even the second
temperature is above 1000° C. In addition, the supplemental
annealing raises the dopant activation level further to make
it comparable to that of a conventional annealing process.
Last but not least, the lack of uniformity of the microwave
annealing can be compensated by the supplemental anneal-
ing.

As a result of the combination of the microwave anneal-
ing and the supplemental annealing, the p-well region and
the n-well region have at least the following benefits: (i)
reduction in extended defects such as dislocation loops; (ii)
low leakage current of the devices fabricated thereon due to
the reduction in extended defects; (iii) high or comparable
dopant activation level; and (iv) low or comparable dopant
loss. These benefits will be discussed below in greater detail
with reference to FIGS. 7-10.

Figure 3:
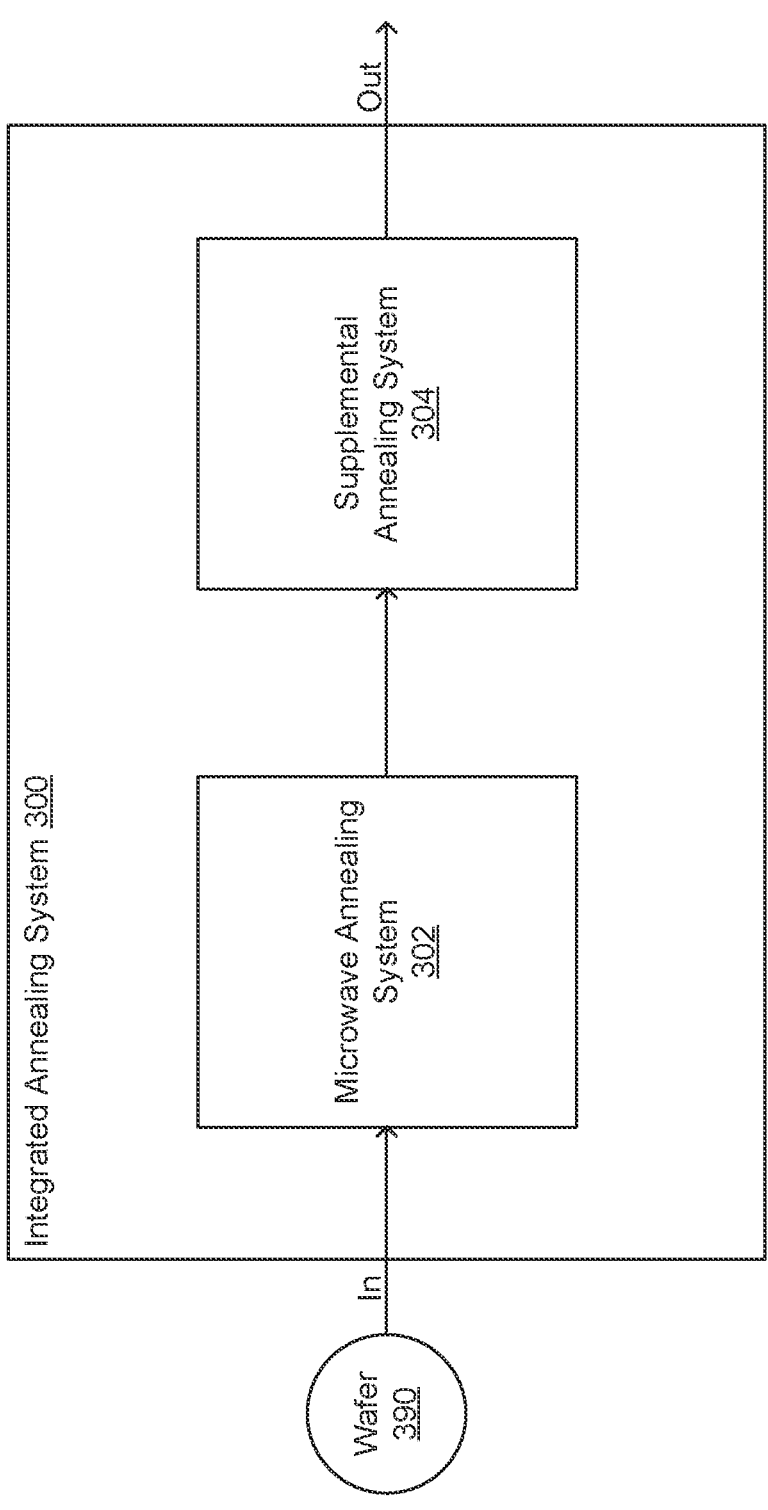
FIG. 3 is a schematic diagram illustrating an example integrated annealing system in accordance with some embodiments.
Figure 4:
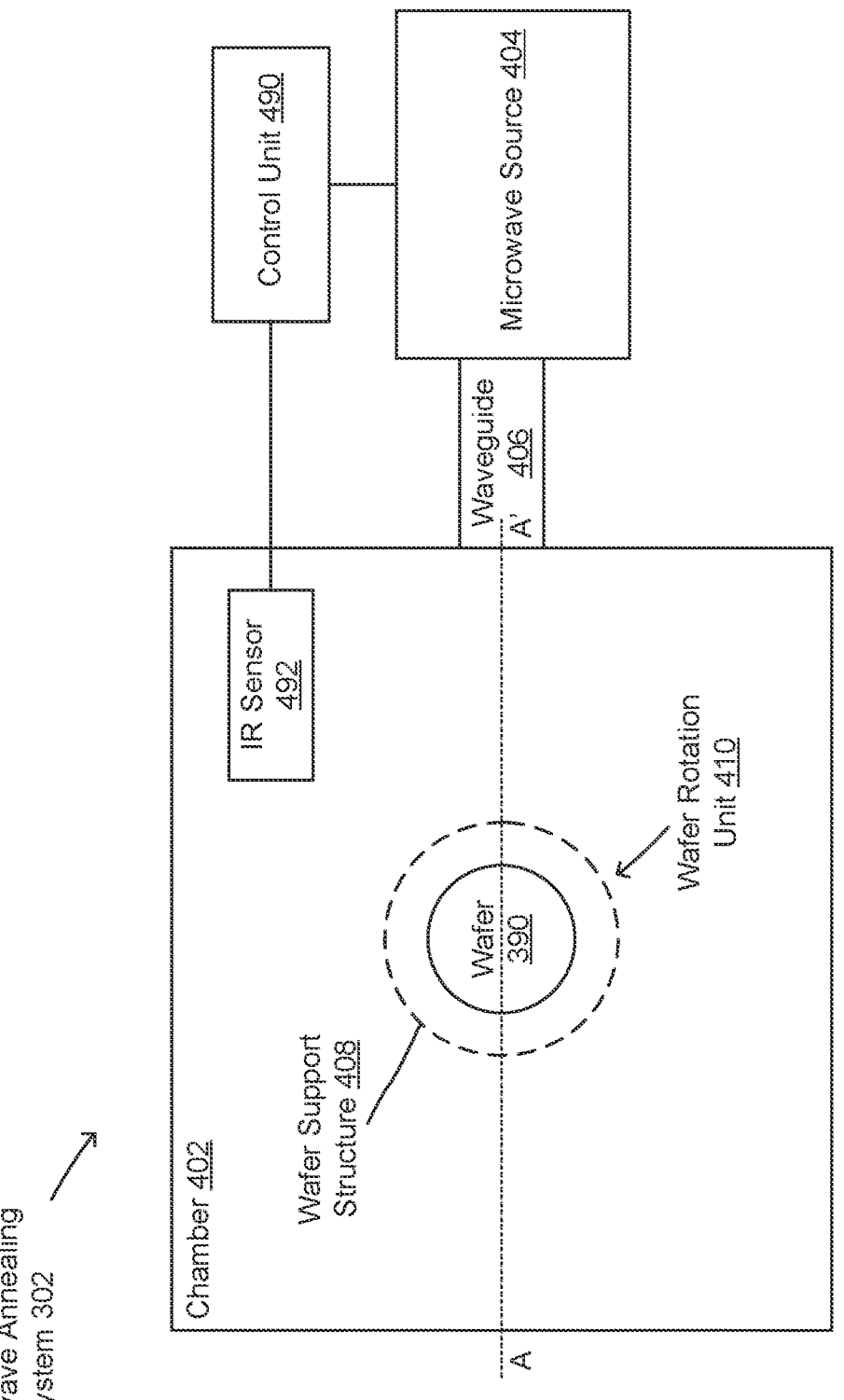
FIG. 4 is a schematic diagram illustrating an example microwave annealing system in accordance with some embodiments.

In one implementation, the microwave annealing and the
supplemental annealing are conducted in an integrated
annealing system. FIG. 3 is a schematic diagram illustrating
an example integrated annealing system 300 in accordance
with some embodiments. FIG. 4 is a schematic diagram
illustrating an example microwave annealing system 302 in
accordance with some embodiments. Details of the inte-
grated annealing system 300 and the microwave annealing
system 302 will be described below with reference to FIGS.
3 and 4.

At operation 112, FETs (e.g., FinFETs or GAAFETs) are
fabricated in the p-well region and the n-well region. Details
of an example operation 112 will be described below with
reference to FIG. 11. It should be understood that other types
of devices can be fabricated in the p-well region and the
n-well region as needed.

Example Integrated Annealing System

In the example shown in FIG. 3, the integrated annealing
system 300 includes, among other components, the micro-
wave annealing system 302 and the supplemental annealing
system 304. The supplemental annealing system 304 is
cascaded with the microwave annealing system 302. A wafer
390 is transferred by, for example, a transfer robot to the
microwave annealing system 302, where the microwave
annealing at the first temperature is conducted. The wafer
390 is subsequently transferred by, for example, another
transfer robot to the supplemental annealing system 304,
where the supplemental annealing at the second temperature
is conducted. After both the microwave annealing and the
supplemental annealing are conducted, the wafer 390 is
transferred out of the integrated annealing system for sub-
sequent processes.

In the example shown in FIG. 4, the microwave annealing
system 302 includes, among other components, a chamber
402, a wafer support structure 408, a wafer rotation unit 410,
a microwave source 404, a waveguide 406, a temperature
sensor such as an infrared (IR) sensor 492, and a control unit
490.

The microwave source 404 is operable to generate micro-
wave radiation. In one implementation, the microwave
source 404 includes a magnetron. In another implementation, the microwave source 404 includes a solid-state power amplifier (SSPA). In one example, the frequency of the microwave radiation ranges from 300 MHz to 300 GHz. In another example, the frequency of the microwave radiation ranges from 300 MHz to 10 GHz. In one example, the overall microwave power ranges from 50 W to 5000 W.

The chamber 402 includes four sidewalls, a bottom wall, and a top wall connected to one another to form a rectangular box. Each of these walls is electrically conductive and electrically connected to the ground. In one implementation, the inner surfaces of the top wall and the bottom wall are spaced apart from each other by a distance that is related to the wavelength of the microwave radiation generated by the microwave source 404. In some implementations, the chamber 402 includes a gas inlet and a gas outlet so gases can be introduced into the chamber 402 during the microwave annealing. Examples of the gases include nitrogen ($N_2$), argon (Ar), or other inert gases. The pressure in the chamber 402 ranges from 0.1 Torr to 760 Torr in some examples.

The waveguide 406 couples the microwave source 404 to one sidewall of the chamber 402 and guides the microwave radiation generated by the microwave source 404 into the chamber 402. In one implementation, the waveguide 406 has a rectangular cross section. In the example shown in FIG. 4, the waveguide 406 is arranged in alignment with the central axis AA' of the chamber 402 for heating uniformity.

The wafer support structure 408 is located at the center of the chamber 402 and operable to support the wafer 390. The wafer rotation unit 410 is engaged with the wafer support structure 408 and operable to rotate the wafer support structure 408 for better heating uniformity. In one implementation, the wafer rotation unit 410 includes a drive motor.

The IR sensor 492 is mounted to, for example, the top wall of the chamber 402 and operable to detect the temperature of the wafer 390. The control unit 490 is electrically connected to the IR sensor 492, the microwave source 404, and other components. The control unit 490 is operable to adjust the microwave power of the microwave radiation generated by the microwave source 404 based on the temperature of the wafer 390 detected by the IR sensor 492 such that the temperature of the wafer 390 can reach and be maintained at the target temperature (e.g., the first temperature). The overall annealing time ranges from 6 seconds to 100 minutes (for saturated lattice recovery) in some examples.

Microwave Annealing: Dopant Activation and Lattice Recovery

Figure 5A:
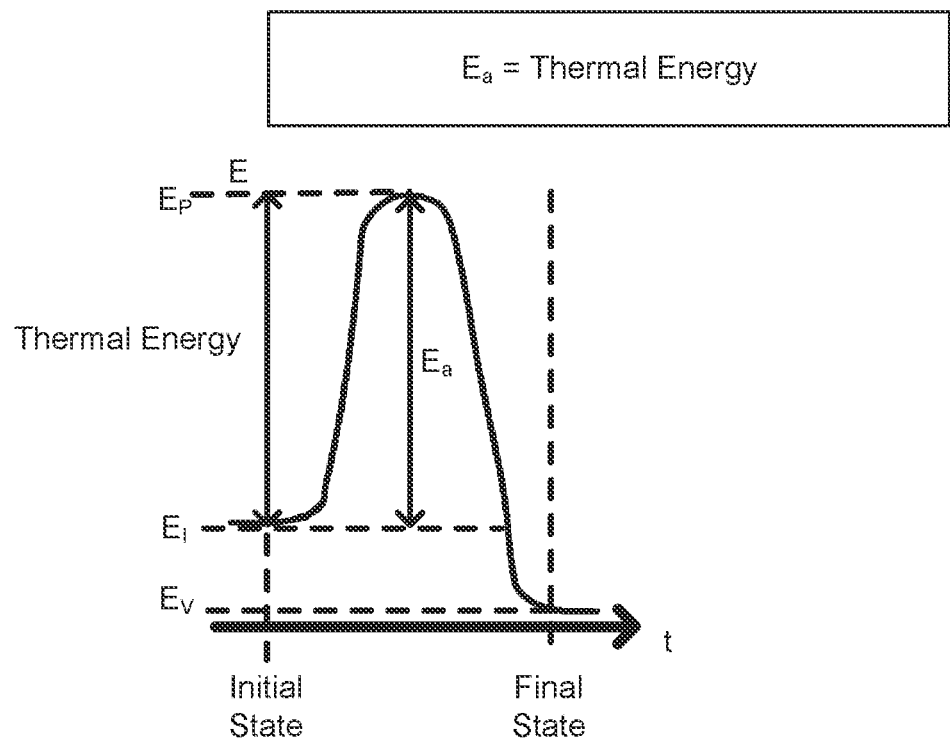
FIG. 5A is a diagram illustrating the energy barrier associated with dopant activation during a conventional annealing.
Figure 5B:
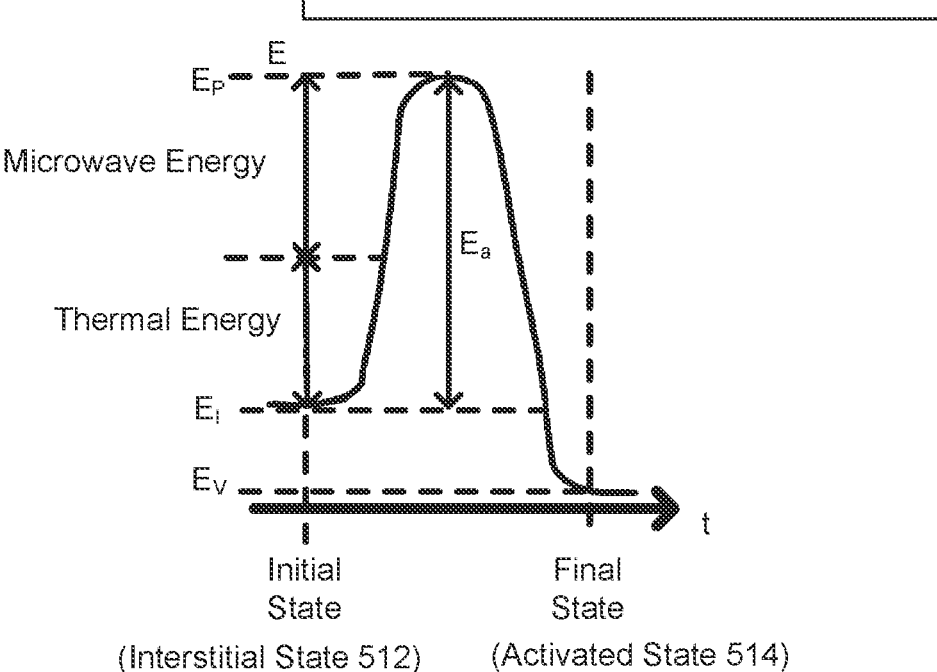
FIG. 5B is a diagram illustrating the energy barrier associated with dopant activation during a microwave annealing in accordance with some embodiments.
Figure 6A:
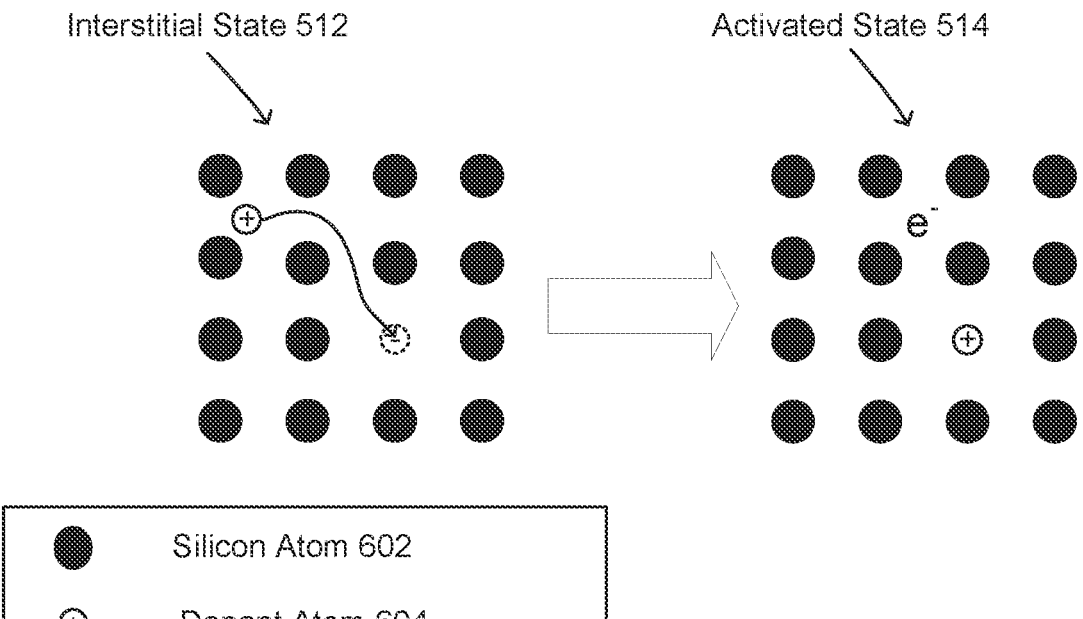
FIG. 6A is a diagram illustrating the dopant activation during a conventional annealing.
Figure 6B:
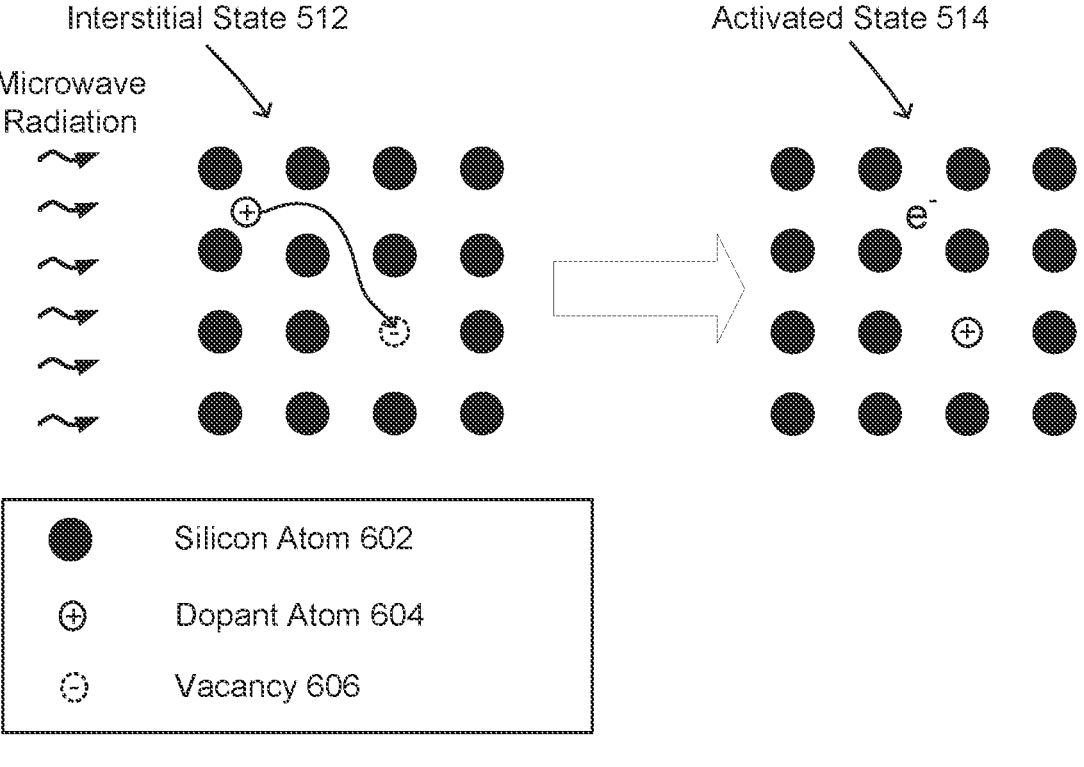
FIG. 6B is a diagram illustrating the dopant activation during the microwave annealing in accordance with some embodiments.

FIG. 5A is a diagram illustrating the energy barrier associated with dopant activation during a conventional annealing. FIG. 5B is a diagram illustrating the energy barrier associated with dopant activation during a microwave annealing in accordance with some embodiments. FIG. 6A is a diagram illustrating the dopant activation during a conventional annealing. FIG. 6B is a diagram illustrating the dopant activation during the microwave annealing in accordance with some embodiments.

As shown in FIGS. 5A and 6A, the dopant atom 604 occupies a site in the crystal structure of silicon at which there is usually not an atom after the ion implantation. In other words, the initial state is an interstitial state 512. A vacancy 606 appears correspondingly at the lattice site which would be occupied in a perfect crystal. After the ion implantation, a portion of the dopant atoms may carry charges, either positive or negative. In the example shown in FIG. 6A, the dopant atom 604 is positively charged, whereas the vacancy 606 is negatively charged. In other words, a dipole comprised of the dopant atom 604 and the vacancy 606 is formed.

The energy of the interstitial state 512 is $E_I$. The dopant atom 604 must overcome an energy barrier, i.e., the activation energy $E_a$, to reach the activated state 514. The activation energy $E_a$ is the difference between $E_I$ and the peak energy $E_P$. The dopant atom 604 obtains the activation energy $E_a$ during the conventional annealing. That is, the activation energy $E_a$ comes from the thermal energy obtained during the conventional annealing.

Due to the thermal energy obtained during the conventional annealing, the dopant atom 604 can overcome the energy barrier and reach the final state, i.e., the activated state 514. The energy of the activated state 514 is $E_v$, which is lower than $E_I$. Therefore, the activated state 514 is more stable than the interstitial state 512. In the example shown in FIG. 6A, the dopant atom 604 occupies the lattice site where the vacancy 606 was previously located. An electron can move freely as a result.

As shown in FIGS. 5B and 6B, a dipole comprised of the dopant atom 604 and the vacancy 606 is formed. The microwave radiation generated during the microwave annealing is a combination of time-variant electric field and time-variant magnetic field. As a result, the dipole comprised of the dopant atom 604 and the vacancy 606 vibrate due to the time-variant electric field. The dopant atom 604 thus gains microwave energy (in the form of kinetic energy).

Therefore, the activation energy $E_a$ needed to overcome the energy barrier shown in FIG. 5B may come from both the microwave energy and the thermal energy. In other words, both the microwave energy and the thermal energy contribute to the activation energy $E_a$ needed. The thermal energy needed in the microwave annealing is thus lower than the thermal energy needed in the conventional annealing. In other words, the microwave annealing can be conducted at a lower temperature (e.g., the first temperature) than the conventional annealing. Accordingly, dopant loss and dopant diffusion are lower due to the lower temperature.

On the other hand, point defects formed during the ion implantation are recovered in the lattice recovery process at the lower temperature. In contrast, at the higher annealing temperature (e.g., the second temperature) during the conventional annealing, point defects formed during the ion implantation recombine or collapse to form extended defects such as dislocation loops.

Since the point defects are recovered prior to the supplemental annealing, the formation of extended defects is significantly avoided during the supplemental annealing. As such, a leakage current can be achieved for devices fabricated in the p-well region 204 and the n-well region 206.

Results and Benefits

Figure 7:
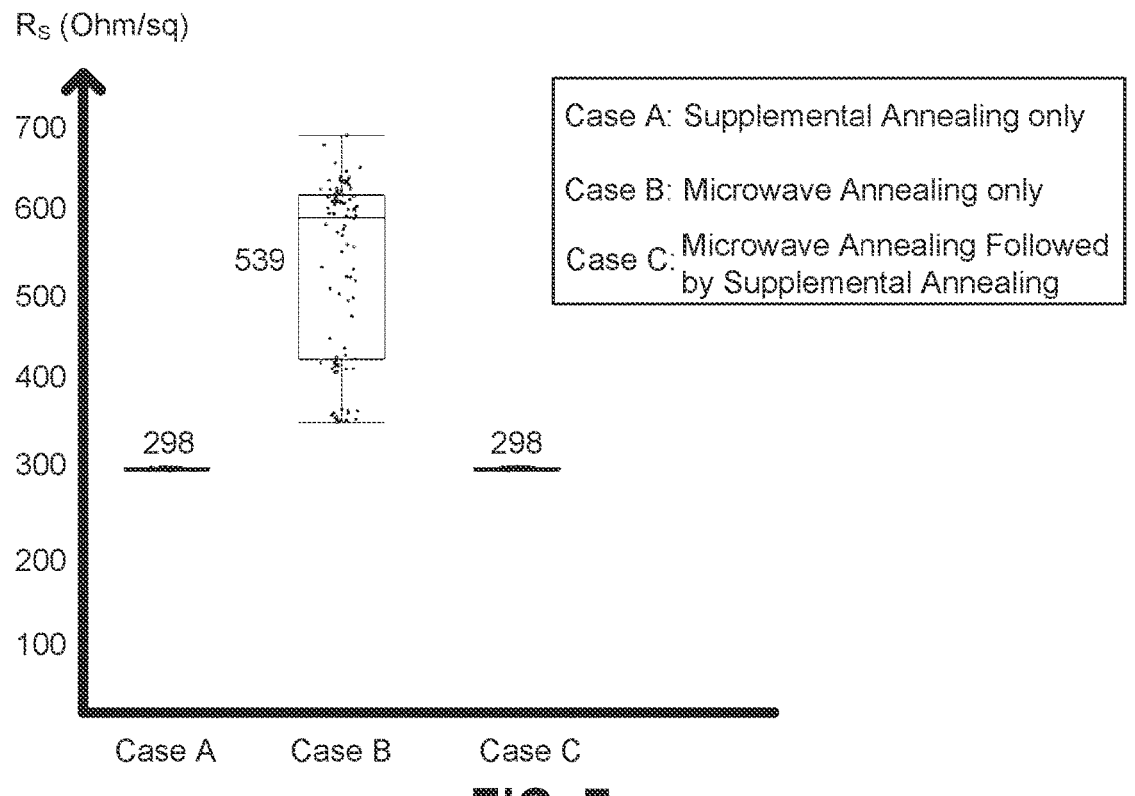
FIG. 7 is a diagram illustrating sheet resistance of the well regions under different annealing conditions in accordance with some embodiments.

FIG. 7 is a diagram illustrating sheet resistance of the well regions under different annealing conditions in accordance with some embodiments. Sheet resistance is a measure of resistance of a material that is nominally uniform in thickness. It is commonly used to characterize materials made by semiconductor doping, metal deposition, etc. The smaller the sheet resistance is, the higher the dopant activation level is.

Three annealing conditions are compared. Case A corresponds to the supplemental annealing (which is a conventional annealing) only. Case B corresponds to the microwave annealing only. Case C corresponds to the microwave annealing followed by the supplemental annealing. As shown in FIG. 7, the sheet resistance for Case C is the same as the sheet resistance for Case A. Thus, the dopant activation level of the combination of microwave annealing and supplemental annealing is comparable to that of the supplemental annealing only. Although the well region subjected to the microwave annealing has a higher sheet resistance and a lower dopant activation level, the subsequent supplemental annealing boosts the dopant activation level to a comparable level.

Figure 8:
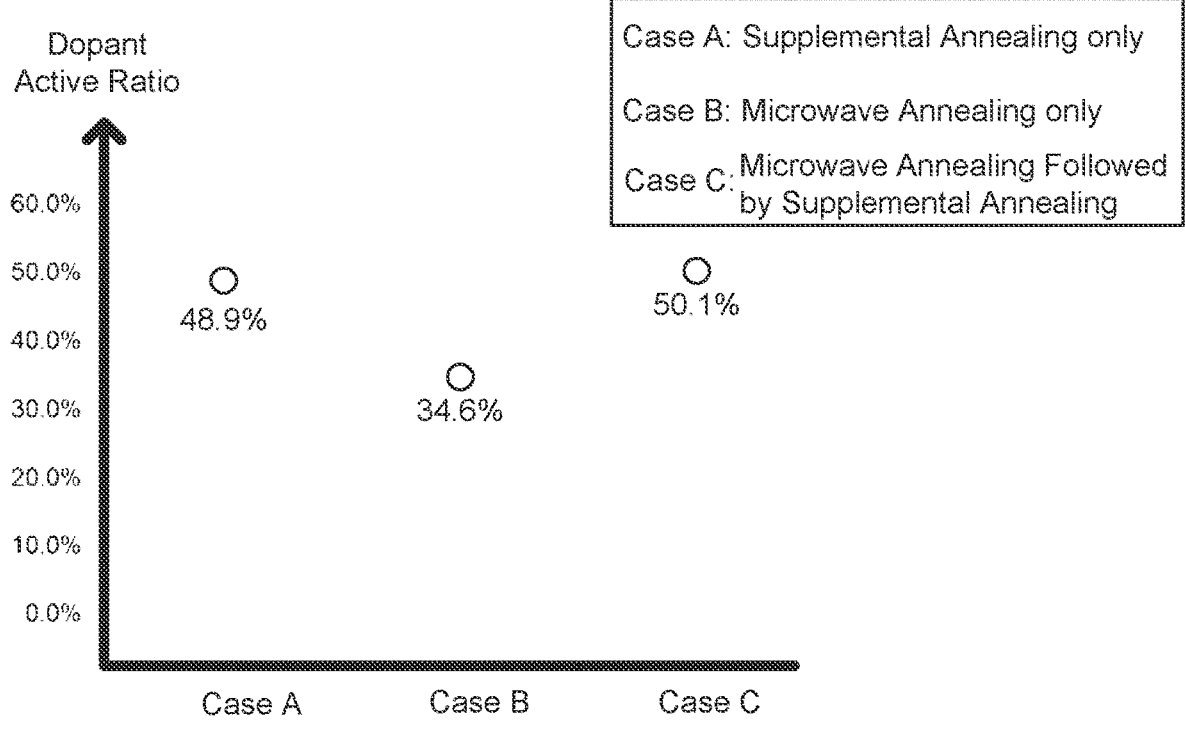
FIG. 8 is a diagram illustrating dopant active ratio of the well regions under different annealing conditions in accordance with some embodiments.

FIG. 8 is a diagram illustrating dopant active ratio of the well regions under different annealing conditions in accordance with some embodiments. Dopant active ratio is a measure of the ratio of the activated dopants to the overall dopants. It is commonly used to characterize the dopant activation level. The higher the dopant active ratio is, the higher the dopant activation level is.

As shown in FIG. 8, the dopant active ratio for Case C is slightly higher than and comparable to the dopant active ratio for Case A. Thus, the dopant activation level of the combination of microwave annealing and supplemental annealing is slightly higher than and comparable to that of the supplemental annealing only. Although the well region subjected to the microwave annealing has a lower dopant activation level, the subsequent supplemental annealing boosts the dopant activation level to a comparable level.

Table 1 below illustrates the dosage loss and junction depth under different annealing conditions. Dopants may diffuse out of the desired region due to diffusion, which is driven by a gradient in concentration. The higher the temperature is, the higher the diffusion coefficient is, and the higher the dosage loss is. Due to diffusion, the junction depth increases as well.

TABLE 1

| ANNEALING CONDITIONS | DOSAGE LOSS (%) | JUNCTION DEPTH (@1E18 CM$^{-3}$) |
|---|---|---|
| Benchmark | Standard | 249.0 nm |
| Case A: Supplemental Annealing Only | −20.8% | 257.5 nm |
| Case B: Microwave Annealing Only | −3.9% | 245.0 nm |
| Case C: Combination | −23.3% | 258.5 nm |

As shown in Table 1, the dosage loss (23.3%) for the combination of microwave annealing and supplemental annealing is slightly higher than and comparable to that (20.8%) for the supplemental annealing only. The dosage loss is extracted using secondary-ion mass spectrometry (SIMS). SIMS is a technique used to analyze the composition of solid surfaces and thin films by sputtering the surface of the specimen with a focused primary ion beam and collecting and analyzing ejected secondary ions. As shown in Table 1, the junction depth (258.5 nm) for the combination of microwave annealing and supplemental annealing is slightly higher than and comparable to that (257.5 nm) for the supplemental annealing only. In other words, the combination of microwave annealing and supplemental annealing does not strengthen the dopant diffusion.

Figure 9:
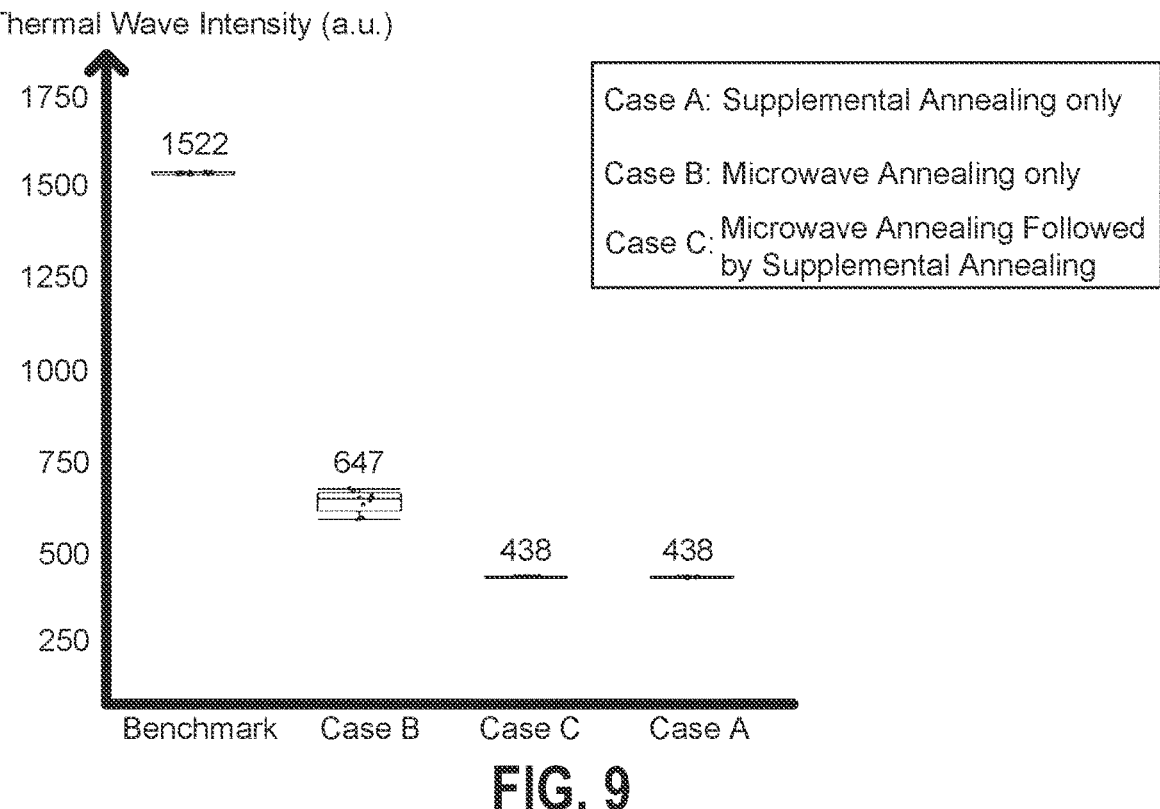
FIG. 9 is a diagram illustrating the thermal wave intensity of the well regions under different annealing conditions in accordance with some embodiments.

FIG. 9 is a diagram illustrating the thermal wave intensity of the well regions under different annealing conditions in accordance with some embodiments. Thermal wave intensity is a measure of lattice damage of a material. The lower the thermal wave intensity is, the better the lattice recovery is.

As shown in FIG. 9, microwave annealing can facilitate lattice recovery after the ion implantation (thermal wave intensity drops from 1522 to 647). Although microwave annealing cannot achieve the same lattice recovery as the supplemental annealing (thermal wave intensity is 438), it can avoid the formation of extended defects such as dislocation loops, as explained above. By conducting a supplemental annealing after the microwave annealing, the comparable lattice recovery can be achieved as the supplemental annealing only.

Figure 10:
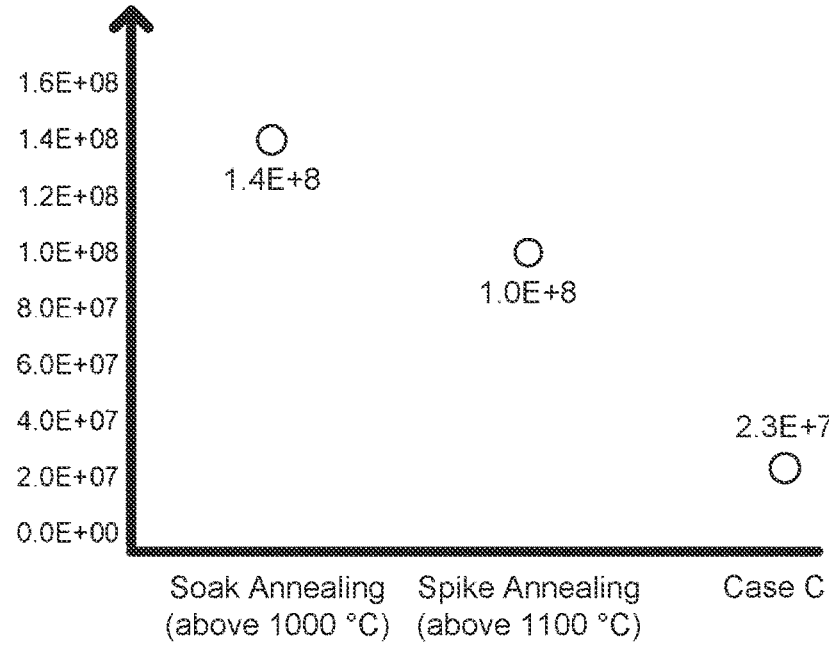
FIG. 10 is a diagram illustrating the dislocation defect concentration of the well regions under different annealing conditions in accordance with some embodiments.

FIG. 10 is a diagram illustrating the dislocation defect concentration of the well regions under different annealing conditions in accordance with some embodiments. Dislocation defect concentration is a measurement of the concentration of dislocation defects in the well regions. In one implementation, the dislocation defect concentration can be obtained by dividing the number of dislocation defects on a profile of the well region by the area of the profile. Multiple profiles (at multiple cross sections) can be used and the average dislocation defect concentration can be obtained accordingly. The lower the dislocation defect concentration is, the fewer the extended defects are formed.

As shown in FIG. 10, the well region subject to the soak annealing (at a temperature above 1000° C. with a duration of several seconds to tens of seconds) has more extended defects than the well region subject to the spike annealing (at a temperature above 1100° C. with a duration of about one second) due to the shorter duration. The well region subject to the combination of the microwave annealing and the supplemental annealing can achieve a even lower dislocation defect concentration because the point defects have been recovered after the microwave annealing, therefore avoiding the formation of extended defects such as dislocation loops.

Fabrication of FinFETs

Figure 11:
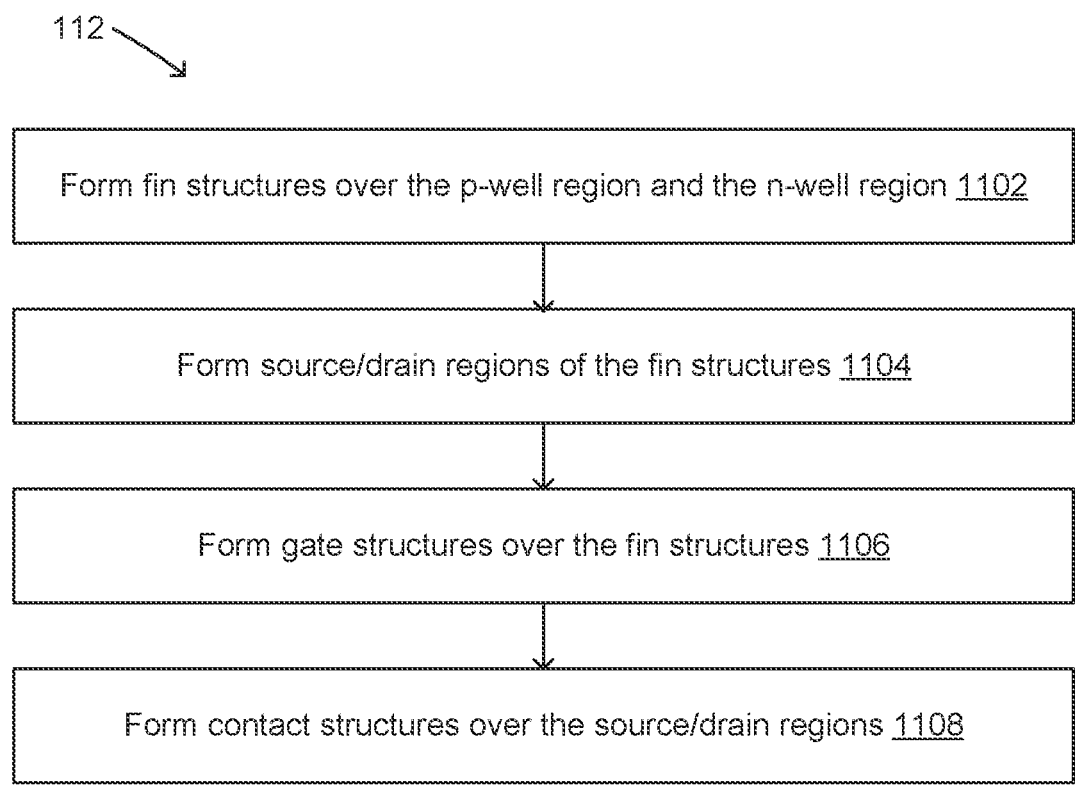
FIG. 11 is flowchart diagram illustrating an example operation 112 shown in FIG. 1 in accordance with some embodiments.

FIG. 11 is flowchart diagram illustrating an example operation 112 shown in FIG. 1 in accordance with some embodiments. Although the fabrication of FinFETs are discussed as an example with reference to FIG. 11, it should be understood that other types of FETs (e.g., GAAFETs) can be fabricated as well using the techniques discussed in the disclosure. In the example shown in FIG. 1, the operation 112 includes operations 1102, 1104, 1106, and 1108. Additional operations may be performed. Also, it should be understood that the sequence of the various operations discussed above with reference to FIG. 11 is provided for illustrative purposes, and as such, other embodiments may utilize different sequences. These various sequences of operations are to be included within the scope of embodiments.

It should also be understood that there may be additional operations between operation 110 and operation 112. In one example, a shallow trench isolation (STI) region is formed between the p-well region 204 and the n-well region 206 for isolating the p-well region 204 and the n-well region 206.

At operation 1102, fin structures are formed over the p-well region 204 and the n-well region 206. In one example, the fin structures extends in one direction. The fin structures may comprise any suitable materials. In one example, the fin structure is a silicon fin structure. In another example, the fin structure may include multiple layers such as one or more epitaxial layers. The fin structures may be formed by any suitable process including various deposition, photolithography, etching, epitaxy, and/or other suitable processes. An exemplary photolithography process may include forming a photoresist layer ("resist") overlying the substrate, exposing the resist to a pattern by using a mask, performing a post-exposure bake process, and developing the resist to form a masking element including the resist. The masking element may then be used for etching to form the fin structures. The etching process may be reactive ion etching (RIE) processes and/or other suitable processes. In another example, the fin structures may be formed by a double-patterning lithography (DPL) process. DPL is a method of constructing a pattern on a substrate by dividing the pattern into two interleaved patterns. DPL allows enhanced fin structure density. Various DPL methodologies may be used including double exposure (e.g., using two mask sets), forming spacers adjacent features and removing the features to provide a pattern of spacers, resist freezing, and/or other suitable processes. It should be understood that other types of fin structures and fin structure materials are also within the scope of the disclosure.

At operation 1104, source/drain regions of the fin structures are formed. In one example, the source/drain regions of the fin structures are doped by performing ion implantation to implant appropriate dopants to complement the dopants in the fin structures. In another example, the source/drain regions of the fin structures are formed by forming a recess in the fin structures and epitaxially growing material in the recess. It should be understood that other types of source/drain structures and forming processes are within the scope of the disclosure.

At operation 1106, gate structures are formed over the fin structures. Each of the gate structures may include a gate dielectric layer, a gate electrode layer, and/or other suitable layers such as capping layers, interface layers, work function layers, diffusion/barrier layers, etc. The gate structures and/or fin structures may be patterned such that the gate structures wrap around a portion of the fin structures. In one example, the gate structures may contact at least three surfaces of the fin structures (e.g., the top and opposing side surfaces). In another example, the gate structures wrap around or quasi-around the fin structures such that the gate structures contact a fourth surface of the fin structures (e.g., the bottom surface). The gate dielectric layer comprises a dielectric material, such as silicon oxide, silicon nitride, high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The gate electrode includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. It should be understood that other gate structures and materials are within the scope of the disclosure.

At operation 1108, contact structures are formed, over the source regions and the drain regions. Specifically, depositing source contact structures and drain contact structures may include, for example, depositing a barrier layer such as titanium nitride, tantalum nitride, tungsten nitride, ruthenium, the like, or a combination thereof, and then depositing a conductive material, such as a metal like aluminum, copper, tungsten, the like, or a combination thereof. The deposition may be by, for example, chemical vapor deposition (CVD), atomic layer deposition (ALD), physical vapor deposition (PVD), the like, or a combination thereof. Excess barrier layer materials and/or conductive materials may be removed later, such as by chemical-mechanical polishing (CMP). In some embodiments, the source contact structures and the drain contact structures are deposited in an inter-layer dielectric (ILD) such as a low-k dielectric layer or extreme low-k dielectric layer. Specifically, the source contact structures and the drain contact structures are formed by forming the interlayer dielectric (ILD), patterning the ILD by using a mask to cover some portions of the ILD while leaving other portions of the ILD exposed, etching the ILD to remove the exposed portions of the ILD to form a recess, and depositing conductive materials in the recess. It should be understood that other types of forming processes and materials are within the scope of the disclosure.

As such, FinFETs are fabricated over the p-well region 204 and the n-well region 206. Although not shown in FIG. 11, first metal (M1) layer and higher-level metal layers can also be formed during back-end-of-line (BEOL) processing to build electrical interconnect for the integrated circuit.

In accordance with some aspects of the disclosure, a method of fabricating an integrated circuit (IC) is provided. The method includes the following steps: providing a substrate; forming a p-well region in the substrate; forming an n-well region in the substrate; conducting a microwave annealing at a first temperature; conducting, after the microwave annealing, a supplemental annealing at a second temperature higher than the first temperature; and fabricating a plurality of field-effect transistors (FETs) in the p-well region and the n-well region.

In accordance with some aspects of the disclosure, a method of fabricating field-effect transistors (FETs) is provided. The method includes the following steps: providing a substrate; forming a p-well region in the substrate; forming an n-well region in the substrate; conducting a microwave annealing at a first temperature; conducting, after the microwave annealing, a supplemental annealing at a second temperature higher than the first temperature; forming a plurality of fin structures over the p-well region and the n-well region; forming a plurality of source regions and a plurality of drain regions of the plurality of fin structures; and forming a plurality of gate structures over the plurality of fin structures.

In accordance with some aspects of the disclosure, an integrated annealing system is provided. The integrated annealing system includes: a microwave annealing system configured to anneal a p-well region and an n-well region formed in a substrate at a first temperature; and a supplemental annealing system cascaded with the microwave annealing system and configured to anneal the p-well region and the n-well region formed in the substrate at a second temperature higher than the first temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit (IC), the method comprising:

providing a substrate;

forming a p-well region in the substrate using a first ion implantation process;

forming an n-well region in the substrate using a second ion implantation process;

conducting, after the first ion implantation process and the second ion implantation process, a microwave annealing at a first temperature, wherein the microwave annealing is conducted at the first temperature to recover point defects created during the first and second ion implantation processes;

conducting, after the microwave annealing, a supplemental annealing at a second temperature higher than the first temperature, wherein the supplemental annealing is a non-microwave annealing, and wherein the supplemental annealing is conducted at the second temperature to activate dopants in the p-well region and the n-well region while avoiding formation of extended defects; and fabricating a plurality of field-effect transistors (FETs) in the p-well region and the n-well region.

2. The method of claim 1, wherein the first temperature is below 800° C.

3. The method of claim 1, wherein the first temperature is below 600° C.

4. The method of claim 1, wherein the second temperature is above 800° C.

5. The method of claim 1, wherein the second temperature is above 1000° C.

6. The method of claim 1, further comprising:

detecting, by a temperature sensor, a temperature of the substrate; and adjusting a microwave source based on the temperature of the substrate such that the temperature of the substrate reaches the first temperature.

7. The method of claim 6, wherein the temperature sensor is an infrared sensor.

8. The method of claim 6, further comprising:

rotating the substrate during the microwave annealing.

9. A method of fabricating field-effect transistors (FETs), the method comprising:

providing a substrate;

forming a p-well region in the substrate using a first ion implantation process;

forming an n-well region in the substrate using a second ion implantation process;

conducting, after the first ion implantation process and the second ion implantation process, a microwave annealing at a first temperature, wherein the microwave annealing is conducted at the first temperature to recover point defects created during the first and second ion implantation processes;

conducting, after the microwave annealing, a supplemental annealing at a second temperature higher than the first temperature, wherein the supplemental annealing is a non-microwave annealing, and wherein the supplemental annealing is conducted at the second temperature to activate dopants in the p-well region and the n-well region while avoiding formation of extended defects;

forming a plurality of fin structures over the p-well region and the n-well region;

forming a plurality of source regions and a plurality of drain regions of the plurality of fin structures; and forming a plurality of gate structures over the plurality of fin structures.

10. The method of claim 9, further comprising:

forming a plurality of contact structures over the plurality of source regions and the plurality of drain regions.

11. The method of claim 9, wherein the first temperature is below 600° C.

12. The method of claim 9, wherein the second temperature is above 1000° C.

13. The method of claim 9, wherein the supplemental annealing is one of a furnace annealing, a rapid thermal annealing (RTA), a millisecond annealing, a microsecond annealing and a laser annealing.

14. The method of claim 9, wherein a power of a microwave source used in the microwave annealing ranges from 50 W to 5000 W.

15. An integrated annealing system, comprising:

a microwave annealing system configured to anneal a p-well region and an n-well region formed in a substrate on a wafer using a microwave annealing at a first temperature;

a supplemental annealing system cascaded with the microwave annealing system and configured to anneal the p-well region and the n-well region formed in the substrate using a supplemental annealing at a second temperature higher than the first temperature, wherein the supplemental annealing is a non-microwave annealing, and wherein the microwave annealing system and the supplemental annealing system are located in close proximity in a housing; and a transfer robot located between the microwave annealing system and the supplemental annealing system and configured to transfer the wafer from the microwave annealing system to the supplemental annealing system.

16. The integrated annealing system of claim 15, wherein the first temperature is below 600° C.

17. The integrated annealing system of claim 15, wherein the second temperature is above 1000° C.

18. The integrated annealing system of claim 15, wherein the microwave annealing system comprises:

a chamber;

a wafer support structure configured to support the substrate;

a microwave source configured to generate a microwave radiation; and a waveguide connecting the microwave source and the chamber and configured to guide the microwave radiation into the chamber.

19. The integrated annealing system of claim 18, wherein the microwave annealing system further comprises:

a temperature sensor configured to detect a temperature of the substrate; and a control unit configured to adjust the microwave source based on the temperature of the substrate such that the temperature of the substrate reaches the first temperature.

* * * * *